(12) United States Patent
Colinge et al.

(10) Patent No.: US 9,865,655 B2
(45) Date of Patent: Jan. 9, 2018

(54) MEMORY CELL STRUCTURE WITH RESISTANCE-CHANGE MATERIAL AND METHOD FOR FORMING THE SAME

(71) Applicant: Taiwan Semiconductor Manufacturing Co., Ltd., Hsinchu (TW)

(72) Inventors: Jean-Pierre Colinge, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/970,001

(22) Filed: Dec. 15, 2015

(65) Prior Publication Data

US 2017/0170236 A1    Jun. 15, 2017

(51) Int. Cl.
*H01L 27/24* (2006.01)
*G11C 13/00* (2006.01)
*H01L 45/00* (2006.01)

(52) U.S. Cl.
CPC ...... *H01L 27/2454* (2013.01); *G11C 13/0069* (2013.01); *G11C 13/0097* (2013.01); *H01L 45/065* (2013.01); *H01L 45/1233* (2013.01); *H01L 45/1253* (2013.01); *H01L 45/148* (2013.01); *H01L 45/1608* (2013.01); *H01L 45/1616* (2013.01); *H01L 45/1625* (2013.01); *G11C 2013/0078* (2013.01)

(58) Field of Classification Search
CPC ....... H01L 45/04; H01L 45/06; H01L 45/144; H01L 45/065; H01L 45/1233; H01L 45/1253; H01L 45/148; H01L 45/1608; H01L 45/1616; H01L 45/1625; G11C 13/0069; G11C 13/0097
See application file for complete search history.

(56) References Cited

U.S. PATENT DOCUMENTS 7,115,927 B2 * 10/2006 Hideki ............... G11C 13/0004
                                              257/2
2006/0057340 A1 * 3/2006 Umeda .................. H01B 1/22
                                              428/209

(Continued)

OTHER PUBLICATIONS

Zhang et al., "Electronic transport properties of single-crystal bismuth nanowire arrays", Physical Review B, Feb. 15, 2000, vol. 61, No. 7, pp. 4850-4861.

(Continued)

*Primary Examiner* — Allen Parker
*Assistant Examiner* — Long H Le
(74) *Attorney, Agent, or Firm* — Birch, Stewart, Kolasch & Birch, LLP

(57) ABSTRACT

Semiconductor structures and methods for forming the same are provided. The semiconductor structure includes a substrate and a memory cell structure formed over the substrate. In addition, the memory cell structure includes a first electrode layer formed over the substrate and a resistance-change material layer formed over the first electrode layer. The memory cell structure further includes a second electrode layer formed over the resistance-change material layer. In addition, the resistance-change material layer includes a semimetal or a semimetal alloy.

20 Claims, 9 Drawing Sheets

(56) References Cited

U.S. PATENT DOCUMENTS

| | | | | |
|---|---|---|---|---|
| 2006/0263289 | A1* | 11/2006 | Heo | B82Y 10/00 423/447.3 |
| 2007/0184613 | A1* | 8/2007 | Kim | G11C 13/0004 438/257 |
| 2008/0142776 | A1* | 6/2008 | Seidl | G11C 11/5678 257/4 |
| 2008/0259673 | A1* | 10/2008 | Wise | G11C 11/15 365/158 |
| 2010/0314602 | A1* | 12/2010 | Takano | G11C 11/5685 257/4 |
| 2011/0026294 | A1* | 2/2011 | Tsukamoto | B82Y 10/00 365/63 |
| 2011/0068316 | A1* | 3/2011 | Takano | H01L 45/1616 257/4 |
| 2011/0317480 | A1* | 12/2011 | Lung | G11C 13/0004 365/163 |
| 2012/0176831 | A1* | 7/2012 | Xiao | G11C 13/0007 365/148 |
| 2013/0033931 | A1* | 2/2013 | Yamane | G11C 11/161 365/171 |
| 2014/0008799 | A1* | 1/2014 | Jong | H01L 23/485 257/751 |
| 2014/0021584 | A1 | 1/2014 | Tu et al. | |
| 2014/0146593 | A1 | 5/2014 | Tsai et al. | |
| 2014/0175365 | A1 | 6/2014 | Chang et al. | |
| 2014/0252295 | A1 | 9/2014 | Liao et al. | |
| 2014/0264222 | A1 | 9/2014 | Yang et al. | |
| 2014/0306174 | A1* | 10/2014 | Murooka | H01L 45/04 257/5 |
| 2015/0155333 | A1* | 6/2015 | Kobayashi | H01L 27/249 365/148 |

OTHER PUBLICATIONS

Chabli, "Overview on the characterization of RRAM technologies", Leti, International Conference on Frontiers of Characterization and Metrology for Nanoelectronics, 2013, total 33 pages.

Chen et al., "Studies of Size Effects in Bi Thin Films", Chinese Journal Of Physics, Oct. 1970, vol. 8, No. 2, pp. 44-47.

Colinge et al., "Grain Size and Resistivity of LPCVD Polycrystalline Silicon Films", J. Electrochem. Soc.: Solid-State Science and Technology, Sep. 1981, vol. 128, No. 9, pp. 2009-2014.

Komnik et al., "Observation of the Quantum and Classical Size Effects in Polycrystalline Thin Bismuth Films", Soviet Physics JETP, Jul. 1968, vol. 27, No. 1, pp. 34-37.

Limmer et al., "Recrystallized Arrays of Bismuth Nanowires with Trigonal Orientation", Nano Letters, 2014, vol. 14, No. 4, pp. 1927-1931.

Moore et al., "Thermal conductivity suppression in bismuth nanowires", Journal of Applied Physics, 2009, vol. 106, pp. 034310-1 to 034310-7.

* cited by examiner

MEMORY CELL STRUCTURE WITH RESISTANCE-CHANGE MATERIAL AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

A resistive random-access memory (RRAM or ReRAM) is a new kind of non-volatile random-access computer memory. A resistive random-access memory works by changing the resistance across a solid-state material, and it is believed that it may be used to replace a flash memory in near future. However, although existing resistive random-access memories have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
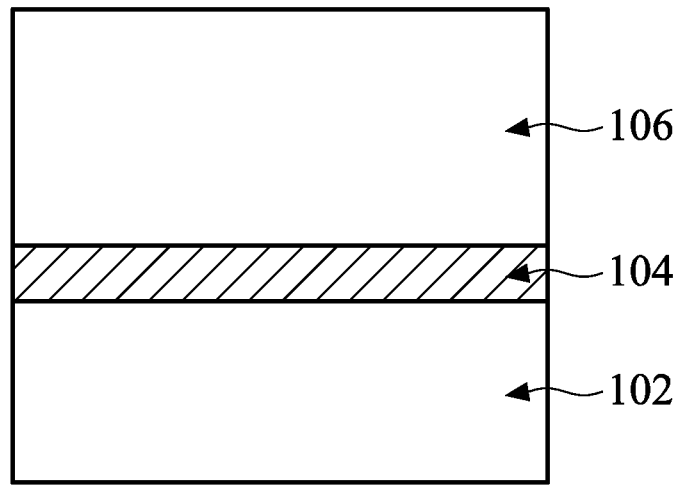
FIGS. 1A to 1D are cross-sectional representations of various stages of forming a memory cell structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The semiconductor structure may include a memory cell structure, such as a resistive random-access memory cell structure. The memory cell structure may include a first electrode layer, a resistance-change material layer, and a second electrode layer. The resistance-change material layer may be formed between the first and second electrode layers and can be melted and recrystallized by applying current pulses thereto. By applying current pulses having different current profiles, the grain size of the resistance-change material may be different, and information may be stored in the memory cell structure can be stored.

FIGS. 1A to 1D are cross-sectional representations of various stages of forming a memory cell structure 100 in accordance with some embodiments. As shown in FIG. 1A, a first electrode layer 104 is formed over a substrate 102 in accordance with some embodiments.

In some embodiments, the substrate 102 is a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, the substrate 102 may include structures such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer. In some embodiments, the substrate 102 includes active components or circuits, such as transistors, conductive features, implantation regions, resistors, capacitors, and other semiconductor elements.

The first electrode layer 104 is formed over the substrate 102, as shown in FIG. 1A in accordance with some embodiments. In some embodiments, the first electrode layer 104 is made of titanium nitride (TiN), tantalum nitride (TaN), platinum (Pt), ruthenium (Ru), iridium (Ir), titanium (Ti), aluminum (Al), copper (Cu), tantalum (Ta), tungsten (W), iridium-tantalum alloy (IrTa), indium-tin oxide (ITO), or combinations thereof. The first electrode layer 104 may be formed by performing a deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, an electroplating process, or a plasma enhanced CVD (PECVD) process. The first electrode layer 104 may be patterned using lithography and etching techniques.

After the first electrode layer 104 is formed, a dielectric layer 106 is formed over the first electrode layer 104, as shown in FIG. 1A in accordance with some embodiments. In some embodiments, the dielectric layer 106 is made of dielectric materials, such as silicon oxide, silicon nitride, silicon oxynitride, and/or other applicable low-k dielectric materials. In some embodiments, the dielectric layer 106 includes multi-layers which are made of various dielectric materials. The dielectric layer 106 may be formed by preforming chemical vapor deposition (CVD) processes, physical vapor deposition (PVD) processes, atomic layer deposition (ALD) processes, spin-on coating, or other applicable processes.

Figure 1B:
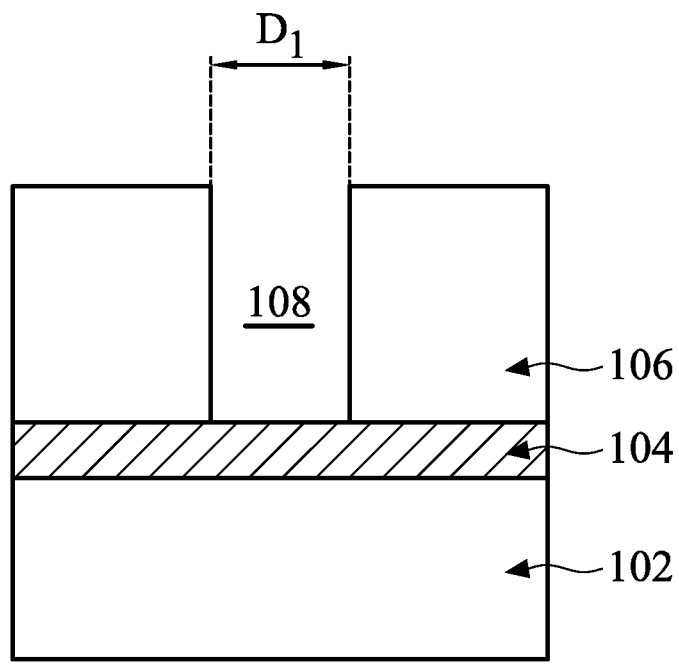

After the dielectric layer 106 is formed, a hole 108 is formed in the dielectric layer 106, as shown in FIG. 1B in accordance with some embodiments. The hole 108 may be formed by any applicable patterning processes. In some embodiments, the hole 108 has a relatively small diameter $D_1$, so that a resistance-change material layer formed in the trench in subsequent processes can have applicable physical properties (Details will be described later).

Figure 1C:
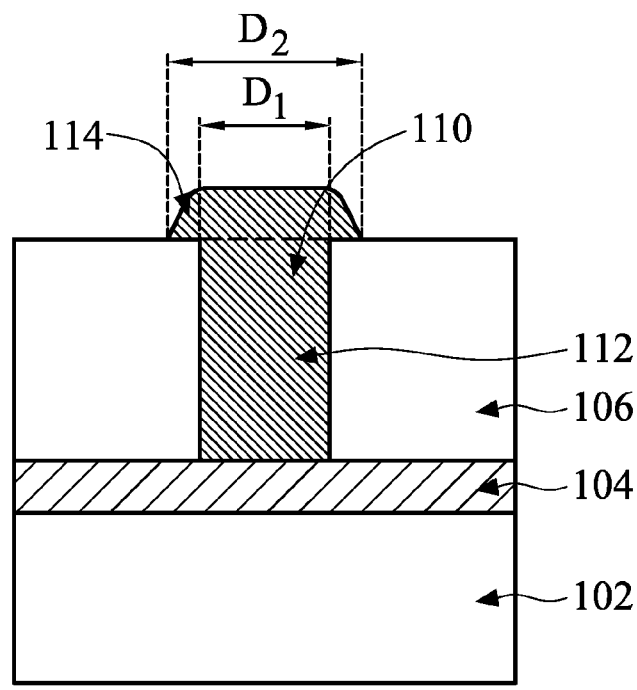

After the hole 108 is formed, a portion of the first electrode layer 104 is exposed by the hole 108. Next, a resistance-change material layer 110 is formed in the hole 108, as shown in FIG. 1C in accordance with some embodiments. The resistance-change material layer 110 is formed on the exposed portion of the first electrode layer 104, and therefore the resistance-change material layer is in direct contact with the first electrode layer 104.

The resistance of the resistance-change material layer 110 may be corresponding to its grain size. In some embodiments, the resistance of the resistance-change material layer 110 changes as the grain size of the resistance-change material layer 110 changes. For example, the resistance-change material layer 110 with a first grain size has a first resistance, and the resistance-change material layer 110 with a second grain size has a second resistance which is different from the first resistance. The grain size of the resistance-change material layer 110 may be changed by melting the resistance-change material layer 110 and recrystallized it afterwards.

In some embodiments, the resistance-change material layer 110 has a melting point in a range from about 150° C. to about 300° C. In some embodiments, the resistance-change material layer 110 has a melting point greater than about 200° C. The material which is used to form the resistance-change material layer 110 may be chosen to have a melting point which is high enough so that it will not be melted by the heat of the circuit operation but is low enough so that the circuit will not be damaged during the melting of the resistance-change material layer 110 (Details will be described later).

In some embodiments, the resistance-change material layer 110 includes a semimetal or a semimetal alloy. In some embodiments, the resistance-change material layer 110 includes bismuth (Bi), tin (Sn), or an alloy thereof. In some embodiments, the resistance-change material layer 110 further includes dopants, such as n-type dopants or p-type dopants. In some embodiments, the resistance-change material layer 110 is doped with Sn, Te, B, P, As, Sb, In, Ga or the like.

In some embodiments, the resistance-change material layer 110 is formed by performing an electroplating process, a chemical vapor deposition (CVD) process, a physical vapor deposition, (PVD) process, or an atomic layer deposition (ALD) process. As described previously, the diameter of the hole 108 may be relatively small. Therefore, an electroplating process may be performed to form the resistance-change material 110 in the hole 108. In some embodiments, the structure shown in FIG. 1B is soaked into a solution containing $BiCl_3$ and $TeCl_4$, and an electroplating process is performed to form the resistance-change material 110. The resulting resistance-change material 110 is made of Bi doped with Te. In some embodiments, the structure shown in FIG. 1B is soaked into a solution containing $BiCl_3$ and $SnCl_4$, and an electroplating process is performed to form the resistance-change material 110. The resulting resistance-change material 110 is made of Bi doped with Sn.

In some embodiments, the resistance-change material layer includes a main portion 112 formed in the hole 108 and a cap portion 114 formed over the main portion 112, as shown in FIG. 1C. As shown in FIG. 1C, the hole 108 is filled with the resistance-change material layer 110 to form the main portion 112, and therefore the main portion 112 of the resistance-change material layer 110 also has a diameter $D_1$. In some embodiments, the diameter $D_1$ of the main portion 112 of resistance-change material layer 110 is in a range from about 5 nm to about 40 nm. As described previously, the resistance-change material layer 110 may be a semimetal, such as Bi, and the band gap of the semimetal increase as the diameter of the material shrunken. Therefore, when the resistance-change material layer 110 has a relatively small diameter, the resistance-change material layer 110 may function as a semiconductor material.

As shown in FIG. 1C, the main portion 112 of the resistance-change material layer 110 is embedded in the dielectric layer 106, and the cap portion 114 of the resistance-change material layer 110 extends over the top surface of the dielectric layer 114. In some embodiments, the diameter $D_2$ of the cap portion 114 is greater than the diameter $D_1$ of the main portion 112, and some portions of the cap portion 114 extend onto the top surface of the dielectric layer 106. Therefore, the contact surface between the resistance-change material layer 110 and the element formed over it may increase.

Figure 1D:
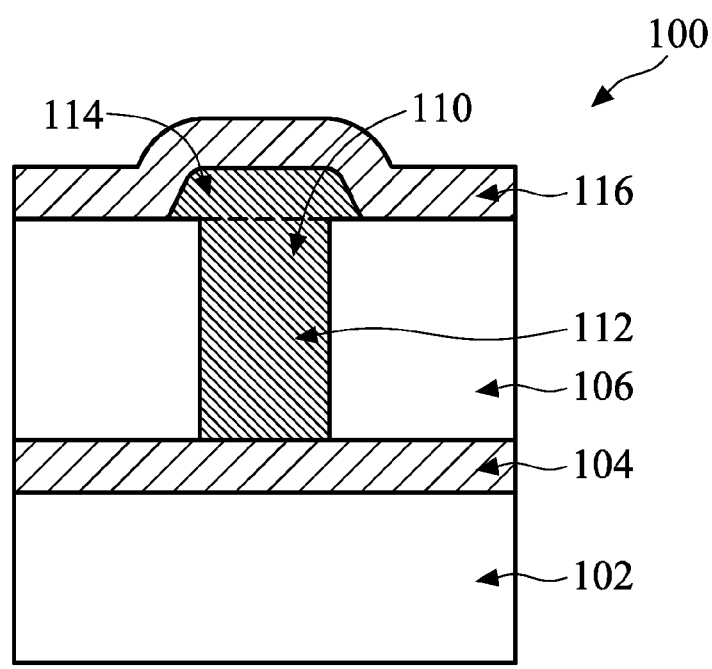

After the resistance-change material layer 110 is formed, a second electrode layer 116 is formed over the resistance-change material layer 110, as shown in FIG. 1D in accordance with some embodiments. In some embodiments, the second electrode layer 116 is made of titanium nitride (TiN), tantalum nitride (TaN), platinum (Pt), ruthenium (Ru), iridium (Ir), titanium (Ti), aluminum (Al), copper (Cu), tantalum (Ta), tungsten (W), iridium-tantalum alloy (IrTa), indium-tin oxide (ITO), or combinations thereof. In some embodiments, the second electrode layer 116 and the first electrode layer 104 are made of the same conductive material.

It should be noted that although the resistance-change material layer 110 is divided into the main portion 112 and the cap portion 114 as shown in FIGS. 1C and 1D, the dotted line is drawn for better understanding the concept of the disclosure. That is, there is no real interface between the main portion 112 and the cap portion 114.

In some embodiments, the first electrode layer 104, the resistance-change material layer 110, and the second electrode layer 116 in the memory cell structure 100 is used as a resistive random-access memory cell structure, and the resistance-change material layer 110 is configured to record information. As described previously, the value of the resistance of the resistance-change material layer 110 changes as its grain size changes. Therefore, a current pulse may be applied to the resistance-change material layer 110 to melt and recrystallize it. In addition, by adjusting the crystallization rate of the resistance-change material layer 110, the grain size of the resulting resistance-change material layer 110 can be controlled. Accordingly, data can be stored in the memory cell structure 100 by applying current pulses.

Figure 2A:
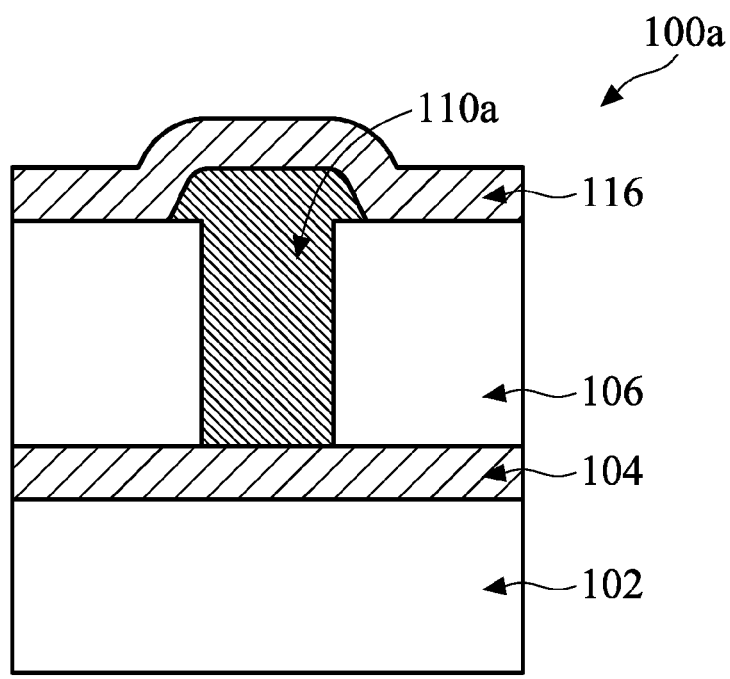
FIGS. 2A to 2C are cross-sectional representation of memory cell structures during different operation states in accordance with some embodiments.
Figure 2B:
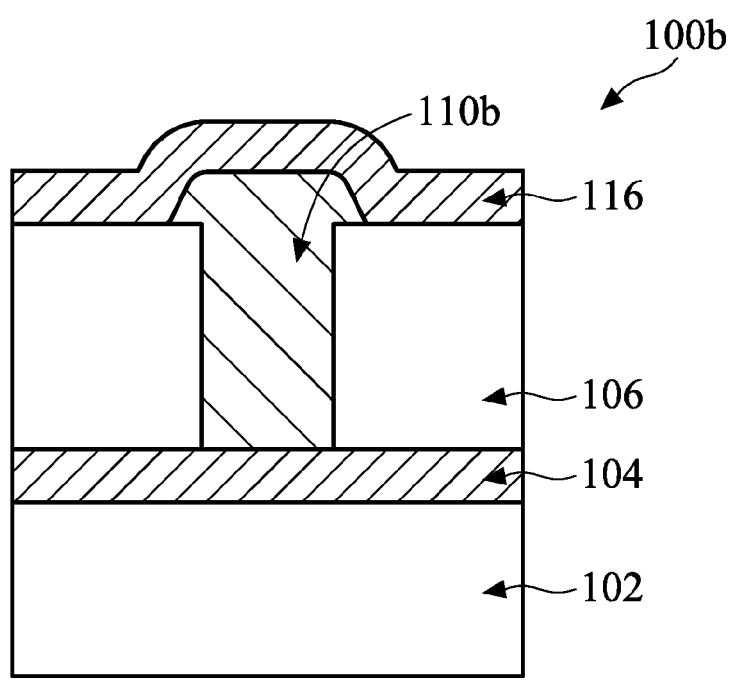
Figure 2C:
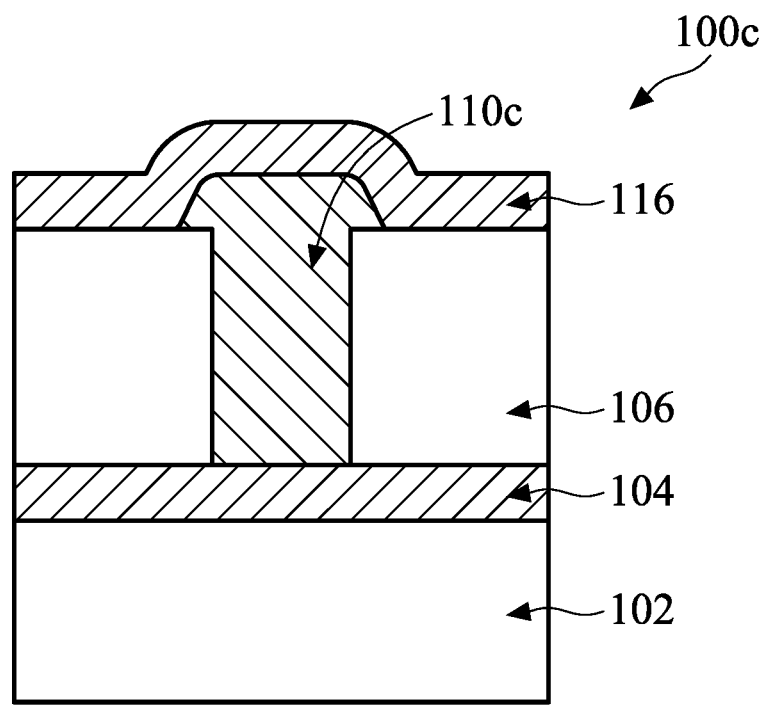

FIGS. 2A to 2C are cross-sectional representation of a memory cell structure during different operation states in accordance with some embodiments. The first-state memory cell structure 100a shown in FIG. 2A may be similar to, or the same as, the memory cell structure 100 described above. In some embodiments, the first-state memory cell structure 100a includes the first electrode layer 104 formed over the substrate 102, a first-state resistance-change material layer 110a formed over the first electrode layer 104, and the second electrode layer 116 formed over the resistance-change material layer 110a. Materials and methods used to form first-state resistance-change material layer 110a may be the same as those used to form resistance-change material layer 110 described previously.

In some embodiments, the first-state resistance-change material layer 110a is made of semimetal or its alloy, such as Bi. In addition, the resistance of the first-state resistance-change material layer 110a changes as its grain size changes. Therefore, by applying a current pulse to the first-state resistance-change material layer 110a, data can be written, erased, and read.

In first-state memory cell structure 100a, the first-state resistance-change material layer 110a may be in its original state and has a first grain size and a first resistance. In some embodiments, the first grain size of the first-state resistance-change material layer 110a is in a range from about 2 nm to about 10 nm.

Figure 3A:
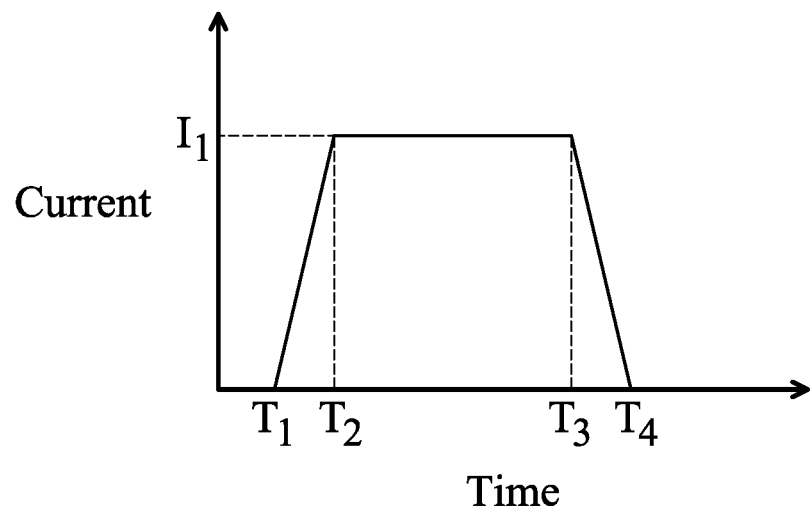
FIG. 3A shows the current profile of the writing current pulse in accordance with some embodiments.
Figure 3B:
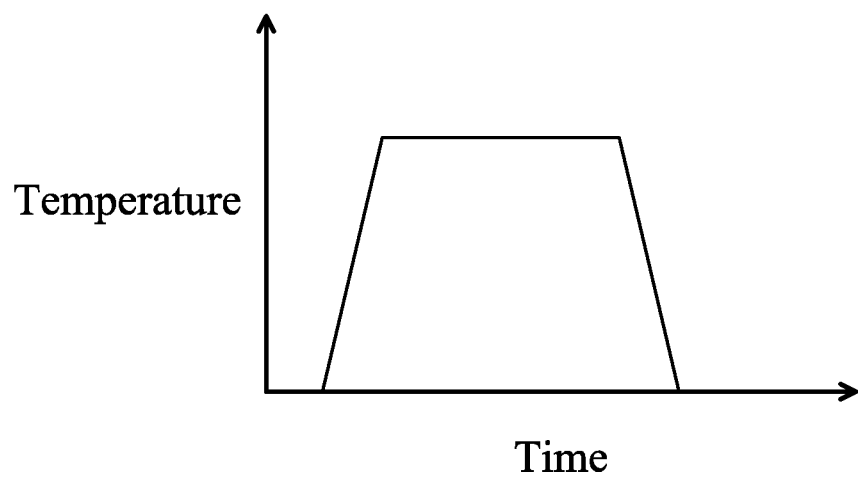
FIG. 3B shows the temperature of the resistance-change material layer while the writing current pulse is applied in accordance with some embodiments.

A writing current pulse is applied to the first-state resistance-change material layer 110a to change its grain size, as shown in FIG. 2B in accordance with some embodiments. FIG. 3A shows the current profile of the writing current pulse in accordance with some embodiments. FIG. 3B shows the temperature of the resistance-change material layer while the writing current pulse is applied in accordance with some embodiments. As shown in FIGS. 3A and 3B, the temperature of the resistance-change material layer is corresponding to the intensity of the given current.

In some embodiments, the writing current pulse has a first rising edge, a first falling edge, and a first pulse width, as shown in FIG. 3A. The first rising edge is defined as the current provided from 0 to $I_1$ within $T_1$ to $T_2$. The first falling edge is defined as the current provided from $I_1$ to 0 within $T_3$ to $T_4$. The first pulse width is defined as the time that the current last, such as from $T_1$ to $T_4$.

The writing current pulse is applied to melt the first-state resistance-change material layer 110a and transfer it into a second-state resistance-change material layer 110b. That is, the first-state resistance-change material layer 110a is heated by applying the writing current pulse. Therefore, the writing current pulse should be adjusted to provide sufficient heat to melt the first-state resistance-change material layer 110a.

In addition, as shown in FIG. 3A, the first falling edge of the writing current pulse has a relatively large slope. That is, after the first-state resistance-change material layer 110a is melted, it is recrystallized in a fast cooling process, as shown in FIG. 3B. Therefore, by applying the writing current pulse, the first-state resistance-change material layer 110a is transferred into the second-state resistance-change material layer 110b with larger crystals and lower resistance in accordance with some embodiments.

The second-state resistance-change material 110b has a second grain size and a second resistance. In some embodiments, the second grain size of the second-state resistance-change material layer 110b is greater than the first grain size of the first-state resistance-change material layer 110a, and the second resistance of the second-state resistance-change material layer 110b is smaller than the first resistance of the first-state resistance-change material layer 110a. In some embodiments, the second-state resistance-change material layer 110b is a single crystal.

Figure 4A:
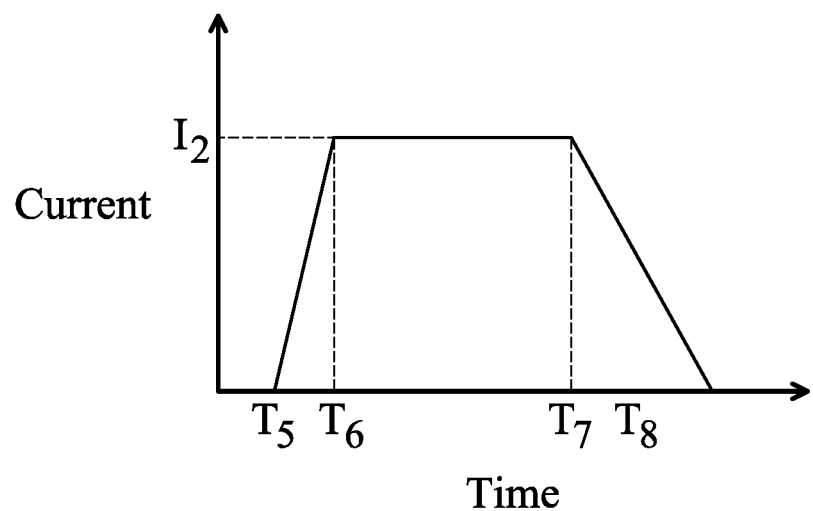
FIG. 4A shows the current profile of the writing current pulse in accordance with some embodiments.
Figure 4B:
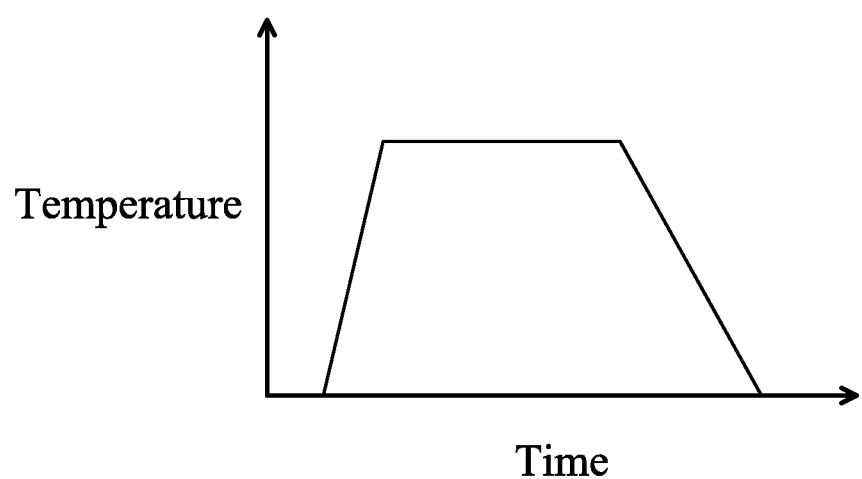
FIG. 4B shows the temperature of the resistance-change material layer while the erasing current pulse is applied in accordance with some embodiments.

A erasing current pulse is applied to the second-state resistance-change material layer 110b to change its grain size, as shown in FIG. 2C in accordance with some embodiments. FIG. 4A shows the current profile of the erasing current pulse in accordance with some embodiments. FIG. 4B shows the temperature of the resistance-change material layer while the erasing current pulse is applied in accordance with some embodiments. As shown in FIGS. 4A and 4B, the temperature of the resistance-change material layer is corresponding to the intensity of the given current.

In some embodiments, the erasing current pulse has a second rising edge, a second falling edge, and a second pulse width, as shown in FIG. 4A. The second rising edge is defined as the current provided from 0 to $I_2$ within $T_5$ to $T_6$. The second falling edge is defined as the current provided from $I_2$ to 0 within $T_7$ to $T_8$. The first pulse width is defined as the time that the current last, such as from $T_4$ to $T_8$.

The erasing current pulse is applied to melt the second-state resistance-change material layer 110b and transfer it into a third-state resistance-change material layer 110c. That is, the second-state resistance-change material layer 110a is heated by applying the erasing current pulse. Therefore, the erasing current pulse should be adjusted to provide sufficient heat to melt the second-state resistance-change material layer 110b. In addition, as shown in FIG. 4A, the second falling edge of the erasing current pulse has a relatively small slope. That is, after the second-state resistance-change material layer 110b is melted, it is recrystallized in a slow cooling process, as shown in FIG. 4B. Therefore, by applying the erasing current pulse, the second-state resistance-change material layer 110b is transferred into the third-state resistance-change material layer 110c with smaller crystals and higher resistance in accordance with some embodiments.

The third-state resistance-change material 110c has a third grain size and a third resistance. In some embodiments, the first current pulse amplitude ($I_1$) of the writing current pulse is substantially equal to the second current pulse amplitude ($I_2$) of the erasing current pulse, and the slope of the first rising edge of the writing current pulse is substantially equal to the slope of the second rising edge of the erasing current pulse. However, the first falling edge of the writing current pulse is greater than the second falling edge of the erasing current pulse. That is, when the writing current pulse is applied, the second-state resistance-change material layer 110b is recrystallized in a fast cooling process. On the other hand, when the erasing current pulse is applied, the third-state resistance-change material layer 100c is recrystallized in a slow cooling process. Accordingly, the second grain size of the second-state resistance-change material layer 110b is greater than the third grain size of the third-state resistance-change material layer 110c in accordance with some embodiments. In addition, the second resistance of the second-state resistance-change material layer 110b is smaller than the third resistance of the third-state resistance-change material layer 110c in accordance with some embodiments.

In some embodiments, the third grain size of the third-state resistance-change material layer 110c is greater than the first grain size of the first-state resistance-change material layer 110a, and the third resistance of the third-state resistance-change material layer 110c is smaller than the first resistance of the first-state resistance-change material layer 110a.

A reading current pulse may be applied to the resistance-change material layer to measure the resistance of the resistance-change material layer. As described previously, by applying different current pulse (e.g. writing current pulse or erasing current pulse), the grain size of the resistance-change material layer will be changed, and therefore the resistance of the resistance-change material layer will be changed. Accordingly, by applying a reading current pulse to measure the resistance of the resistance-change material layer, the state of the memory cell structure (e.g. the second-state memory cell structure 100b or the third-state memory cell structure 100c) can be known, and the data can be read.

Since the reading current pulse is applied for measuring the resistance of the resistance-change material layer, the reading current pulse should be relatively small so the resistance-change material layer will not be melted. In some embodiments, the current pulse amplitude of the reading current pulse is smaller than the first current pulse amplitude ($I_1$) of the writing current pulse and the second current pulse amplitude ($I_2$) of the erasing current pulse. In some embodiments, the pulse width of the reading current pulse is smaller than the first pulse width of the writing current pulse and the second pulse width of the erasing current pulse.

Figure 5:
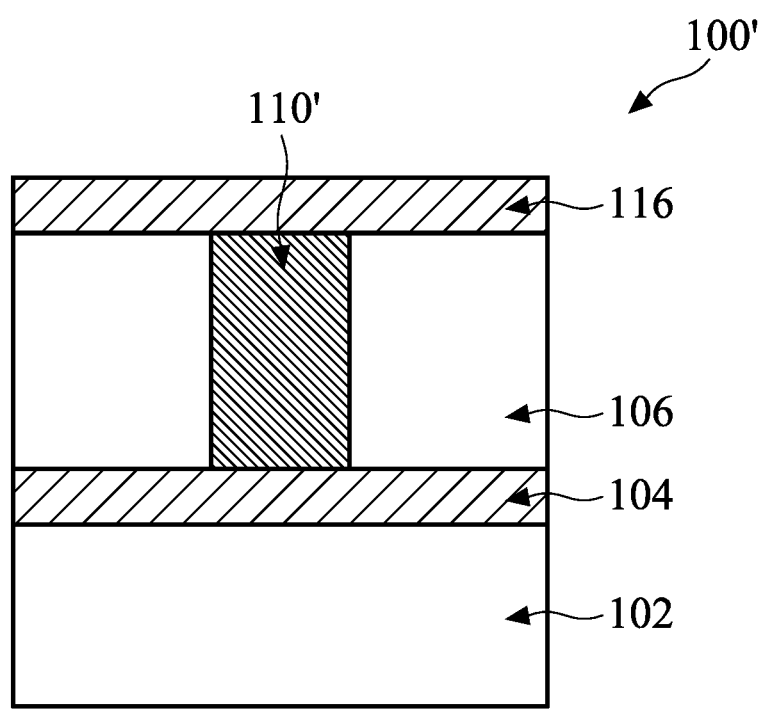
FIG. 5 is a cross-sectional representation of a memory cell structure 100' in accordance with some embodiments.

FIG. 5 is a cross-sectional representation of a memory cell structure 100' in accordance with some embodiments. The memory cell structure 100' is similar to, or the same as, the memory cell structure 100 described previously, except the cap portion of the resistance-change material layer is removed. Some processes and materials used to form the memory cell structure 100' may be similar to, or the same as, those used to form the memory cell structure 100 and are not repeated herein.

More specifically, the processes shown in FIGS. 1A to 1C may be performed. However, before the second electrode layer 116 is formed, a polishing process may be performed to remove the cap portion of the resistance-change material layer. Therefore, the top surface of the resulting resistance-change material layer 110' is substantially level with the top surface of the dielectric layer 106.

Similar to the memory cell structures described above, the resistance-change material layer 110' of the memory cell structure 100' is configured to store data by applying a writing current pulse or an erasing current pulse to change its grain size. In addition, a reading current pulse may be applied to read the data by measuring the resistance of the resistance-change material layer 110'.

As described previously, a resistance-change material layer (e.g. the resistance-change material layer 110) of a memory cell structure (e.g. the memory cell structure 100) can be used to store data by applying a writing current pulse or an erasing current pulse, and the stored data can be read by applying a reading current pulse. In some embodiments, the current pulse is applied to the resistance-change material layer by a transistor formed below the memory cell structure.

Figure 6:
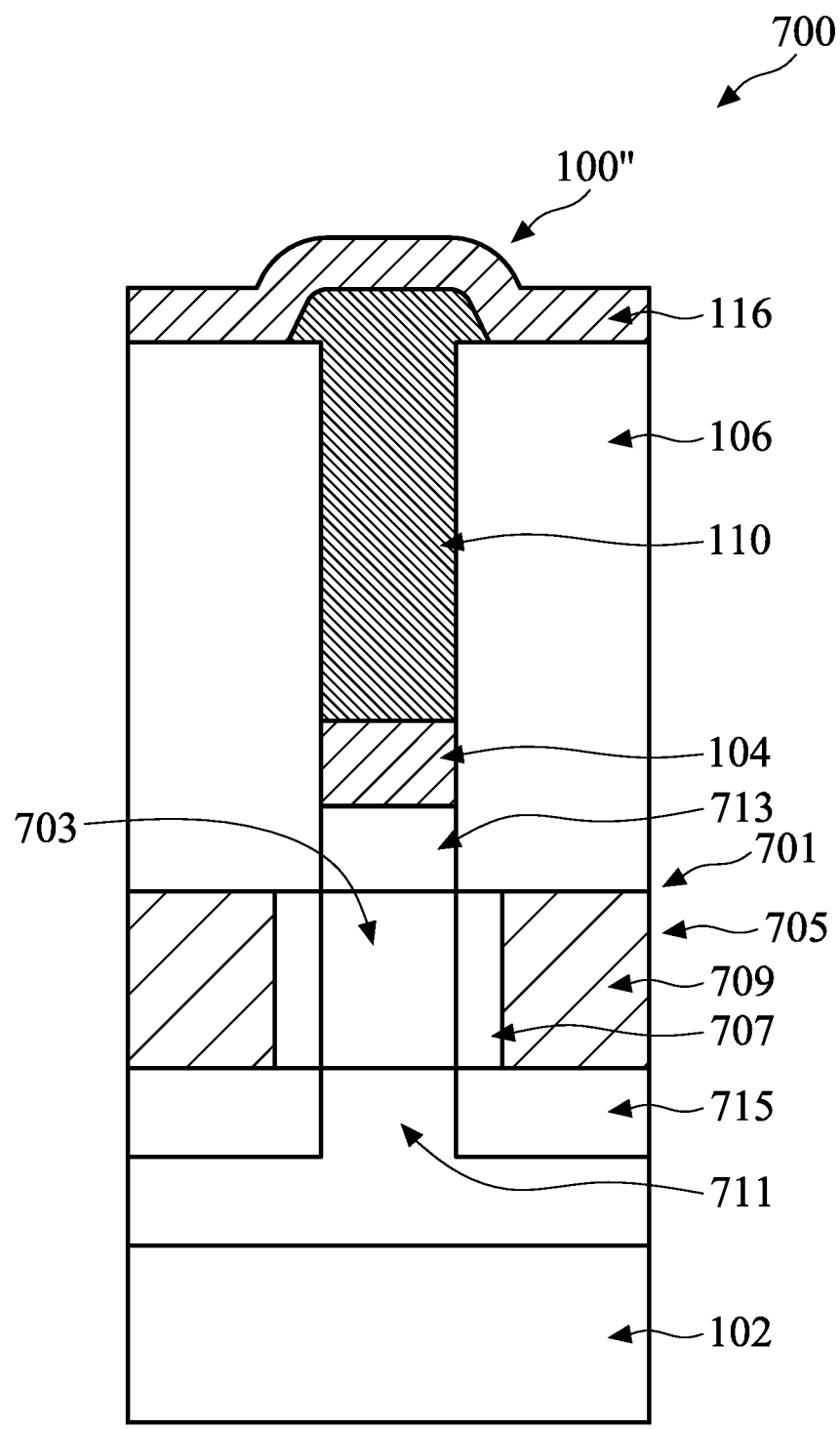
FIG. 6 is a cross-section representation of a semiconductor structure in accordance with some embodiments.

FIG. 6 is a cross-section representation of a semiconductor structure 700 in accordance with some embodiments. The semiconductor structure 700 includes a nanowire field effect transistor structure 701 formed over a substrate 102 and a memory cell structure 100" formed over the nanowire field effect transistor structure 701. The nanowire field effect transistor structure 701 may be used to provide a current pulse (e.g. a writing current pulse, an erasing current pulse, or a reading current pulse) to the memory cell structure 100" to change the grain size of the resistance-change material layer therein or the measure the resistance of the resistance-change material layer.

More specifically, the memory cell structure 100" includes a first electrode layer 104, a resistance-change material layer 110 formed over the first electrode layer 104, and a second electrode layer 116 formed over the resistance-change material layer 110 in accordance with some embodiments. The first electrode layer 104 and the resistance-change material layer 110 is surrounded by a dielectric layer 106. The processes and materials used to form the memory cell structure 100" may be similar to, or the same as, those used to form the memory cell structure 100 described previously and are not repeated herein.

The nanowire field effect transistor structure 701 includes a nanowire structure 703, and a gate structure 705 is formed around the nanowire structure 703, as shown in FIG. 6 in accordance with some embodiments. In some embodiments, the gate structure 705 includes a gate dielectric layer 707 and a gate electrode layer 709. A source structure 711 and a drain structure 713 are formed adjacent to the gate structure 705 and are at opposite ends of the nanowire structure 703. The source structure 711 is surrounded by an interlayer dielectric layer 715.

As shown in FIG. 6, the first electrode layer 104 is formed on the drain structure 713 of the nanowire field effect transistor structure 701 in accordance with some embodiments. In some embodiments, the drain structure 713 is in direct contact with the first electrode layer 104. In addition, the nanowire field effect transistor structure 701 is configured to apply a current pulse to change the grain size of the resistance-change material layer 110. For example, a writing current pulse, an erasing current pulse, or/and a reading current pulse (as shown in FIGS. 2A to 2C and described previously) may be applied to the memory cell structure 100". In addition, the current pulsed applied to the memory cell structure 100" may be controlled by the gate structure 705, so that data can be written, erased, or read in the memory cell structure 100".

In addition, as described above, the resistance-change material layer 110 is made of a material with an appropriate melting point. For example, the melting point of the resistance-change material layer 110 is high enough that the state of the resistance-change material layer 110 will not be changed (e.g. melted) due to the heat of operating the elements (e.g. transistors) formed below. On the other hand, the melting point of the resistance-change material layer 110 is low enough to be melted and recrystallized by providing a current pulse, while the melting temperature is not too high to damage the elements (e.g. transistors) formed below.

In some embodiments, the nanowire structure 703 is made of silicon. Alternatively or additionally, the nanowire structure 703 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenide, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In some embodiments, the gate dielectric layer 707 is made of silicon oxide, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina (HfO$_2$—Al$_2$O$_3$) alloy, or other applicable dielectric materials.

In some embodiments, the gate electrode layer 709 includes a single layer or multilayer structure. In some embodiments, the gate electrode layer 709 is made of polysilicon. In some embodiments, the gate electrode layer 709 includes a work function metal layer and a metal gate electrode layer. The work function metal layer may be tuned to have a proper work function. For example, if a P-type work function metal (P-metal) for a PMOS device is desired, P-type work function materials may be used. Examples of P-type work function materials include, but are not limited to, titanium nitride (TiN), tantalum carbide (TaC), tungsten nitride (WN), tungsten (W), ruthenium (Ru), palladium (Pd), platinum (Pt), cobalt (Co), nickel (Ni), P-type polysilicon, conductive metal oxides, and/or other applicable materials.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, N-type polysilicon, Aluminum (Al), Yttrium (y), Erbium (Er), Tantalum (Ta) and/or other applicable materials.

The metal gate electrode layer may be formed over the work function metal layer and may be made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials.

In some embodiments, the source structure 711 and the drain structure 713 are forming by doping dopants in the nanowire structure 703. In some embodiments, the source structure 711 and the drain structure 713 are formed by growing a strained material by an epitaxial (epi) process. In addition, the lattice constant of the strained material may be different from the lattice constant of the substrate 102. In some embodiments, the source structure 711 and the drain structure 713 include Ge, SiGe, InAs, InGaAs, InSb, GaAs, GaSb, InAlP, InP, or a combination thereof.

In some embodiments, the interlayer dielectric layer 715 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The interlayer dielectric layer 715 may be formed by chemical vapor deposition (CVD), physical vapor deposition, (PVD), atomic layer deposition (ALD), spin-on coating, or other applicable processes.

As described previously, the gate structure 705 may apply a current pulse to the resistance-change material layer 110 of the memory cell structure 100″. Accordingly, the gate structure 705 may be seen as a bit line and the second electrode layer 116 may be seen as a word line in the semiconductor structure 700. The gate structure 705 (e.g. the bit line) and the second electrode layer 116 (e.g. word line) may be arranged orthogonally when viewing from a top view.

It should be noted that, although the nanowire field-effect transistor structure 701 is shown in FIG. 6, other types of transistors may be used to apply the current pulse. For example, a memory cell structure (e.g. the memory cell structures 100, 100′, and 100″) may be formed on a drain structure adjacent to a gate structure in a FinFET, a horizontal nanowire FET, or a planar FET.

Figure 7:
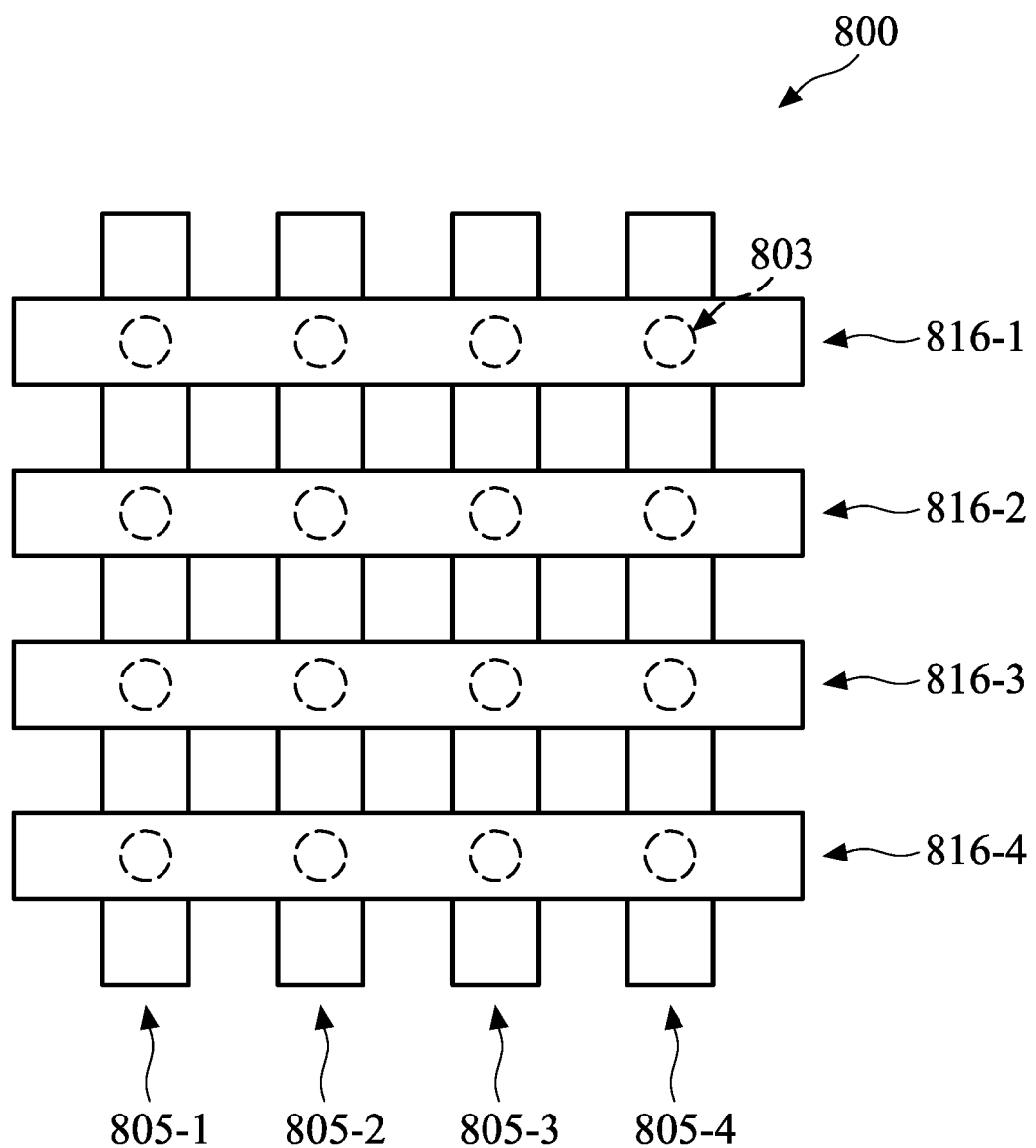
FIG. 7 is a layout of a semiconductor structure in accordance with some embodiments.

FIG. 7 is a layout of a semiconductor structure 800 in accordance with some embodiments. The semiconductor structure 800 includes word lines 816-1, 816-2, 816-3, and 816-4 and bit lines 805-1, 805-2, 805-3, and 805-4 in accordance with some embodiments. Memory cell structures are formed at the intersection of each word line and bit line.

In some embodiments, a writing current pulse is applied to the word line 816-1 by the bit line 805-4, so that the resistance-change material layer of the memory cell structure 803 can be melted and recrystallized in a fast cooling process, similar to, or the same as, those shown in FIGS. 2B and 3A and described previously. Therefore, data can be written in the memory cell structure 803.

In some embodiments, an erasing current pulse is applied to the word line 816-1 by the bit line 805-4, so that the resistance-change material layer in the memory cell structure 803 can be melted and recrystallized in a slow cooling process, similar to, or the same as, those shown in FIGS. 2C and 3B and described previously. Therefore, data can be erased in the memory cell structure 803.

In some embodiments, a reading current pulse is applied to the word line 816-1 by the bit line 805-4, so the resistance of the resistance-change material layer in the memory cell structure 803 can be measured. Therefore, the data in the memory cell structure 803 can be read.

For a metal, the resistance will not change as its grain size changes. On the other hand, for a semiconductor material such as GeTe, the resistance will change as its grain size changes. However, the melting point of the semiconductor material may be too low, such that the semiconductor material tends to be melted during operation of logic transistors if they are positioned too close to each other.

Accordingly, in some embodiments of the disclosure, a memory cell structure (e.g. the memory cell structures 100, 100′, or 100″) includes a resistance-change material (e.g. the resistance-change material 110). In some embodiments, the resistance-change material layer is made of a semimetal or its alloy. The resistance of the resistance-change material layer varies depending on its grain size. That is, the resistance of the resistance-change material layer changes as the grain size of the resistance-change material layer changes. Therefore, it can be used to record information in the memory cell structure.

In addition, since the substrate 102 may include logic elements, such as transistors, the melting point of the resistance-change material may be high enough so that it will not be melted due to the heat produced by operating the logic elements. On the other hand, the melting point of the resistance-change material may not be too high, so the logic elements will not be damaged due to the heat used to melt the resistance-change material layer. Since the resistance-change material layer of the memory cell structure will not be damaged by and will not damage the logic elements, the logic elements and the memory cell structure may be formed on the same substrate 102 (e.g. a silicon chip). Therefore, the size of the resulting semiconductor structure can be minimized and the alignment during the manufacturing process for the semiconductor structure can be improved.

Furthermore, the resistance-change material may be heated by applying a current pulse to change its grain size. More specifically, the current pulse may provide heat to the resistance-change material layer, so that the resistance-change material layer will be melted and recrystallized. By applying the current pulse having different current profiled, the recrystallization rate of the resistance-change material layer will also be different, and therefore the grain size of the resulting resistance-change material layer will be different.

In some embodiments, the grain size of the resistance-change material layer is enlarged when the writing current pulse is applied. In some embodiments, the grain size of the resistance-change material layer is shrunken when the erasing current pulse is applied. In some embodiments, the current pulse may be applied by a transistor structure (e.g. nanowire field effect transistor structure 701). For example, a first electrode layer (e.g. the first electrode layer 104) may be formed on a drain structure (e.g. the drain structure 713) near a gate structure (the gate structure 705) of a transistor structure. Therefore, the current pulse may be applied and controlled by the gate structure. In addition, the process for forming the memory cell structure may be implemented in the present manufacturing process without adding many complicated processes.

Embodiments of a semiconductor structures are provided. The semiconductor structure includes a memory cell structure, and the memory cell structure includes a first electrode layer, a resistance-change material layer, and a second electrode layer. The resistance-change material layer includes a semimetal or its alloy, so that the resistance of the resistance-change material layer changes as the grain size of the resistance-change material changes. Accordingly, the resistance-change material may be used to store information by changing the grain size of the resistance-change material.

In some embodiments, a semiconductor structure is provided. The semiconductor structure includes a substrate and a memory cell structure formed over the substrate. In addition, the memory cell structure includes a first electrode layer formed over the substrate and a resistance-change material layer formed over the first electrode layer. The memory cell structure further includes a second electrode layer formed over the resistance-change material layer. In addition, the resistance-change material layer comprises a semimetal or a semimetal alloy.

In some embodiments, a semiconductor structure is provided. The semiconductor structure includes a substrate and a gate structure formed over the substrate. The semiconductor structure further includes a drain structure formed adjacent to the gate structure and a first electrode layer formed over the drain structure. The semiconductor structure further includes a resistance-change material layer formed over the first metal layer and a second electrode layer formed over the resistance-change material layer.

In some embodiments, a method for manufacturing a semiconductor structure is provided. The method for manufacturing a semiconductor structure includes forming a first electrode layer over a substrate and forming a dielectric layer over the first electrode layer. The method for manufacturing a semiconductor structure further includes forming a trench in the dielectric layer and forming a resistance-change material layer in the trench. The method for manufacturing a semiconductor structure further includes forming a second electrode layer over dielectric layer to cover the resistance-change material layer. In addition, the resistance-change material layer has a melting point greater than about 150° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a nanowire structure formed over the substrate;
   a drain structure formed over the nanowire structure; and
   a memory cell structure formed over the drain structure, wherein the memory cell structure comprises:
      a first electrode layer formed over the substrate;
      a resistance-change material layer formed over the first electrode layer; and
      a second electrode layer formed over the resistance-change material layer,
   wherein the resistance-change material layer comprises a semimetal or a semimetal alloy and is positioned between the first electrode layer and the second electrode layer, and the resistance-change material layer has a melting point in a range of about 150° C. to about 300° C.

2. The semiconductor structure as claimed in claim 1, wherein the resistance-change material layer comprises Bi, Sn, or an alloy thereof.

3. The semiconductor structure as claimed in claim 1, wherein the resistance-change material layer is doped with Sn, Te, B, As, Sb, Ga, In, or P.

4. The semiconductor structure as claimed in claim 1, wherein the substrate comprises a transistor structure comprising:
   a gate structure; and
   a drain structure formed adjacent to the gate structure, wherein the drain structure is in direct contact with the first electrode layer.

5. The semiconductor structure as claimed in claim 4, wherein the transistor structure is configured to apply a current pulse to change a grain size of the resistance-change material layer.

6. The semiconductor structure as claimed in claim 1, further comprising:
   a dielectric layer formed over the first electrode layer, wherein a main portion of the resistance-change material layer is embedded in the dielectric layer, and a cap portion of the resistance-change material layer extends over a top surface of the dielectric layer.

7. The semiconductor structure as claimed in claim 1, wherein the resistance-change material layer is a single crystal.

8. The semiconductor structure as claimed in claim 1, wherein the memory cell structure is formed on the nanowire transistor structure, and the nanowire transistor structure is configured to provide a current pulse to the memory cell structure.

9. The semiconductor structure as claimed in claim 8, further comprising:
a gate structure formed around the nanowire structure, wherein the first electrode is formed over the drain structure.

10. The semiconductor structure as claimed in claim 1, wherein the resistance-change material layer is made of Bi doped with Te or Bi doped with Sn.

11. A semiconductor structure, comprising:
a substrate;
a nanowire structure formed over the substrate;
a drain structure formed on the nanowire structure;
a first electrode layer formed over the drain structure;
a resistance-change material layer formed over the first electrode layer; and
a second electrode layer formed over the resistance-change material layer,
wherein the resistance-change material layer is a semimetal layer or a semimetal alloy layer and is positioned between the first electrode layer and the second electrode layer.

12. The semiconductor structure as claimed in claim 11, further comprising:
a gate structure formed around the nanowire structure, wherein the gate structure is configured to provide a current pulse to melt the resistance-change material layer.

13. The semiconductor structure as claimed in claim 11, wherein the resistance-change material layer has a diameter in a range from about 5 nm to about 40 nm.

14. The semiconductor structure as claimed in claim 11, wherein the resistance-change material layer with a first grain size has a first resistance at a first stage, and the phase material layer with a second grain size has a second resistance at a second stage, and the first grain size is greater than the second grain size, and the first resistance is smaller than the second resistance.

15. The semiconductor structure as claimed in claim 11, wherein a diameter of the nanowire structure is substantially equal to a diameter of the resistance-change material layer.

16. A method for manufacturing a memory cell, comprising:
forming a drain structure over a nanowire structure over a substrate;
forming a first electrode layer over the drain structure;
forming a dielectric layer over the first electrode layer;
forming a trench in the dielectric layer;
forming a resistance-change material layer in the trench;
forming a second electrode layer over dielectric layer to cover the resistance-change material layer, wherein the resist-change material layer is a semimetal layer or a semimetal alloy layer and is positioned between the first electrode layer and the second electrode layer,
wherein a grain size of the resistance-change material layer is enlarged when a writing current pulse is applied to the resistance-change material layer, and the grain size of the resistance-change material layer is shrunken when an erasing current pulse is applied to the resistance-change material layer, and a slope of a falling edge of the writing current pulse is greater than a slope of a falling edge of the erasing current pulse.

17. The method for manufacturing a semiconductor structure as claimed in claim 16, wherein the resistance-change material layer is formed by performing an electroplating process.

18. The method for manufacturing a semiconductor structure as claimed in claim 16, further comprising:
transforming the resistance-change material layer into a single crystal.

19. The method for manufacturing a semiconductor structure as claimed in claim 18, wherein the resistance-change material layer is transformed into a single crystal by recrystallizing the resistance-change material layer.

20. The semiconductor structure as claimed in claim 16, wherein the resistance-change material layer is recrystallized to have the first grain size when the writing current pulse is applied to the resistance-change material layer, and the resistance-change material layer is recrystallized to have the second grain size when the erasing current pulse is applied to the resistance-change material layer.

* * * * *